United States Patent
Staals

(10) Patent No.: US 12,050,406 B2
(45) Date of Patent: *Jul. 30, 2024

(54) METHOD FOR CONTROLLING A LITHOGRAPHIC APPARATUS AND ASSOCIATED APPARATUSES

(71) Applicant: ASML NETHERLANDS B.V., Veldhoven (NL)

(72) Inventor: Frank Staals, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 53 days.

This patent is subject to a terminal disclaimer.

(21) Appl. No.: 17/953,751

(22) Filed: Sep. 27, 2022

(65) Prior Publication Data

US 2023/0021079 A1   Jan. 19, 2023

Related U.S. Application Data

(63) Continuation of application No. 16/762,616, filed as application No. PCT/EP2018/081297 on Nov. 15, 2018, now Pat. No. 11,487,209.

(30) Foreign Application Priority Data

Dec. 6, 2017 (EP) ..................... 17205643

(51) Int. Cl.
 *G03F 7/00* (2006.01)
(52) U.S. Cl.
 CPC ...... *G03F 7/70483* (2013.01); *G03F 7/70625* (2013.01); *G03F 7/70633* (2013.01); *G03F 7/70641* (2013.01)
(58) Field of Classification Search
 CPC .............. B30B 11/006; B30B 15/0005; B30B 15/0094; B30B 3/04; B02C 25/00;
 (Continued)

(56) References Cited

U.S. PATENT DOCUMENTS

| 7,703,069 B1 | 4/2010 | Liu et al. |
|---|---|---|
| 2006/0033921 A1 | 2/2006 | Den Boef et al. |

(Continued)

FOREIGN PATENT DOCUMENTS

| CN | 106104387 | 11/2016 |
|---|---|---|
| CN | 106164777 | 11/2016 |

(Continued)

OTHER PUBLICATIONS

International Search Report and Written Opinion issued in corresponding PCT Patent Application No. PCT/EP2018/081297, dated Feb. 11, 2019.

(Continued)

*Primary Examiner* — Deoram Persaud
(74) *Attorney, Agent, or Firm* — Pillsbury Winthrop Shaw Pittman, LLP

(57) ABSTRACT

A method for controlling a lithographic apparatus, and associated apparatuses. The method is configured to provide product structures to a substrate in a lithographic process and includes determining optimization data. The optimization data includes measured and/or simulated data of at least one performance parameter associated with the product structures and/or their arrangement which are to be applied to the substrate in the lithographic process. Substrate specific metrology data as measured and/or modelled before the providing of product structures to the substrate is determined, the substrate specific metrology data including metrology data relating to a characteristic of the substrate to which the structures are being applied and/or the state of the lithographic apparatus at the time that the structures are applied to the substrate. The method further includes optimizing control of the lithographic apparatus during the lithographic process based on the optimization data and the substrate specific metrology data.

20 Claims, 4 Drawing Sheets

(58) Field of Classification Search
CPC .... B02C 4/02; B02C 4/28; B02C 4/32; G03F 7/70483; G03F 7/70616; G03F 7/70625; G03F 7/70633; G03F 7/70641

See application file for complete search history.

(56) References Cited

U.S. PATENT DOCUMENTS

| | | |
|---|---|---|
| 2006/0066855 A1 | 3/2006 | Den Boef et al. |
| 2008/0079934 A1 | 4/2008 | Scheer |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2016/0370711 A1 | 12/2016 | Schmitt-Weaver et al. |
| 2018/0074413 A1* | 3/2018 | Hunsche ............ G03F 7/70641 |
| 2020/0278614 A1* | 9/2020 | Werkman ............ G03F 7/70616 |
| 2021/0208511 A1* | 7/2021 | Tel ...................... G03F 7/70558 |
| 2022/0146946 A1* | 5/2022 | Staals ................. G03F 7/70483 |
| 2023/0082858 A1* | 3/2023 | Wildenberg ............ G03F 7/705 355/53 |

FOREIGN PATENT DOCUMENTS

| | | |
|---|---|---|
| KR | 20160130810 | 11/2016 |
| WO | 2009078708 | 6/2009 |
| WO | 2009106279 | 9/2009 |
| WO | 2009148976 | 12/2009 |
| WO | 2013178422 | 12/2013 |
| WO | 2015131969 | 9/2015 |
| WO | 2016202559 | 12/2016 |

OTHER PUBLICATIONS

Taiwanese Office Action issued in corresponding Taiwanese Patent Application No. 107143185, dated Nov. 12, 2019.
Chinese Office Action issued in corresponding Chinese Patent Application No. 201880079283, dated Apr. 28, 2022.
Korean Office Action issued in corresponding Korean Patent Application No. 10-2020-7016288, dated Jan. 4, 2022.

* cited by examiner

METHOD FOR CONTROLLING A LITHOGRAPHIC APPARATUS AND ASSOCIATED APPARATUSES

This application is a continuation of U.S. patent application Ser. No. 16/762,616, filed May 8, 2020, which is the U.S. national phase entry of PCT Patent Application No. PCT/EP2018/081297, which was filed on Nov. 15, 2018, which claims the benefit of priority of European Patent Application No. 17205643.4, which was filed on Dec. 6, 2017, each of the foregoing applications is incorporated herein in its entirety by reference.

FIELD

The present description relates to methods and apparatus for applying patterns to a substrate in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entireties. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY

In a first aspect of the invention, there is provided a method for controlling a lithographic apparatus configured to provide product structures to a substrate in a lithographic process, the method comprising: determining optimization data comprising measured and/or simulated data of at least one performance parameter associated with the product structures which are to be applied to the substrate in the lithographic process; determining substrate specific metrology data as measured and/or modeled before the providing of product structures to the substrate, said substrate specific metrology data comprising metrology data relating to a characteristic of the substrate to which the structures are being applied and/or the state of the lithographic apparatus at the time that the structures are applied to the substrate; and optimizing control of the lithographic apparatus during the lithographic process based on said optimization data and the substrate specific metrology data.

In a second aspect of the invention, there is provided a processing device for determining optimization data for controlling a lithographic apparatus which is configured to provide product structures to a substrate in a lithographic process, the processing device being configured to: determine optimization data comprising measured and/or simulated data of at least one performance parameter associated with the product structures and/or their arrangement which are to be applied to the substrate in the lithographic process; said optimization data being usable by the lithographic apparatus in combination with substrate specific metrology data in optimizing control of the lithographic apparatus during the lithographic process; wherein the at least one performance parameter comprises focus, dose, overlay, contrast radiation system output bandwidth and contrast Moving Standard Deviation of an error in substrate stage and/or reticle stage positioning of the lithographic apparatus; and send the optimization data to the lithographic apparatus.

In a third aspect of the invention, there is provided a lithographic apparatus which is configured to provide product structures to a substrate in a lithographic process, said lithographic apparatus comprising: a substrate stage for holding the substrate; a reticle stage for holding a patterning device; a metrology system operable to measure substrate specific metrology data before the providing of product structures to the substrate; and a processor operable to optimize control of the lithographic apparatus during the lithographic process based on optimization data and the substrate specific metrology data; wherein said optimization data comprising measured and/or simulated data of at least one performance parameter associated with the product structures and/or their arrangement which are to be applied to the substrate in the lithographic process.

In a fourth aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
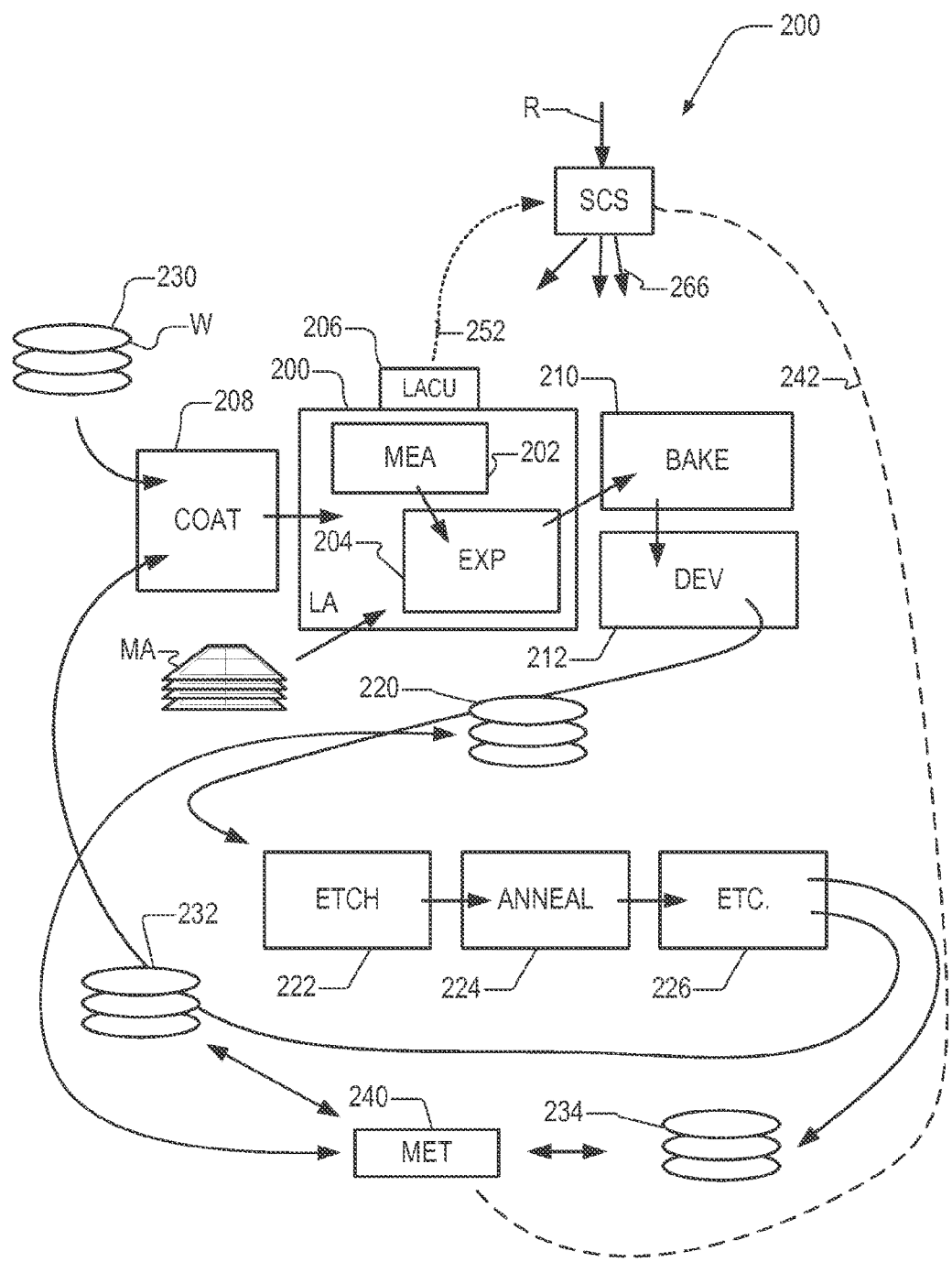
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station— between which the substrate tables can be exchanged.

Within the production facility, apparatus 200 forms part of a "litho cell" or "litho cluster" that also contains a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2A:
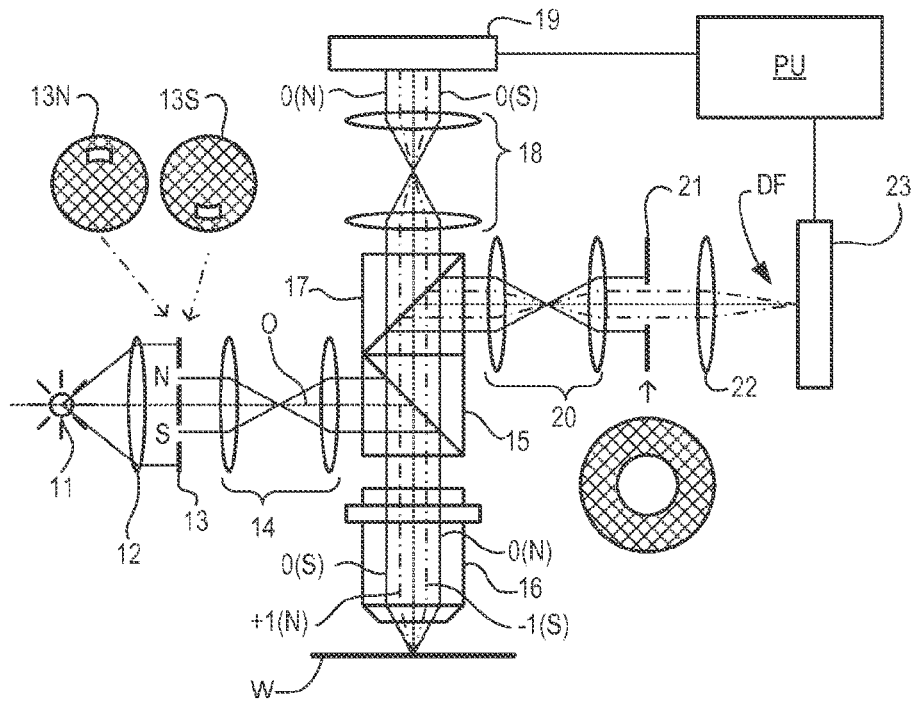
FIG. 2(a) and FIG. 2(b) comprise schematic diagrams of a scatterometer for use in measuring targets according to embodiments of the invention.

A metrology apparatus suitable for use in embodiments of the invention is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labelled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labelled 'south'. Other modes of illumination are possible by using different apertures. The rest of the pupil plane is desirably dark as any unnecessary light outside the desired illumination mode will interfere with the desired measurement signals.

Figure 2B:
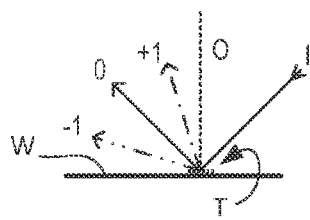

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labelled as north (N) and south (S). When the incident ray I of measurement radiation is from the north side of the optical axis, that is when the first illumination mode is applied using aperture plate 13N, the +1 diffracted rays, which are labelled +1(N), enter the objective lens 16. In contrast, when the second illumination mode is applied using aperture plate 13S the −1 diffracted rays (labelled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$ $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In other words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
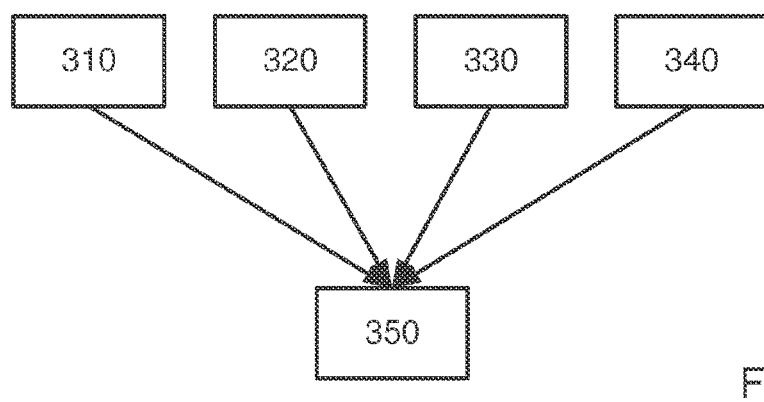
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
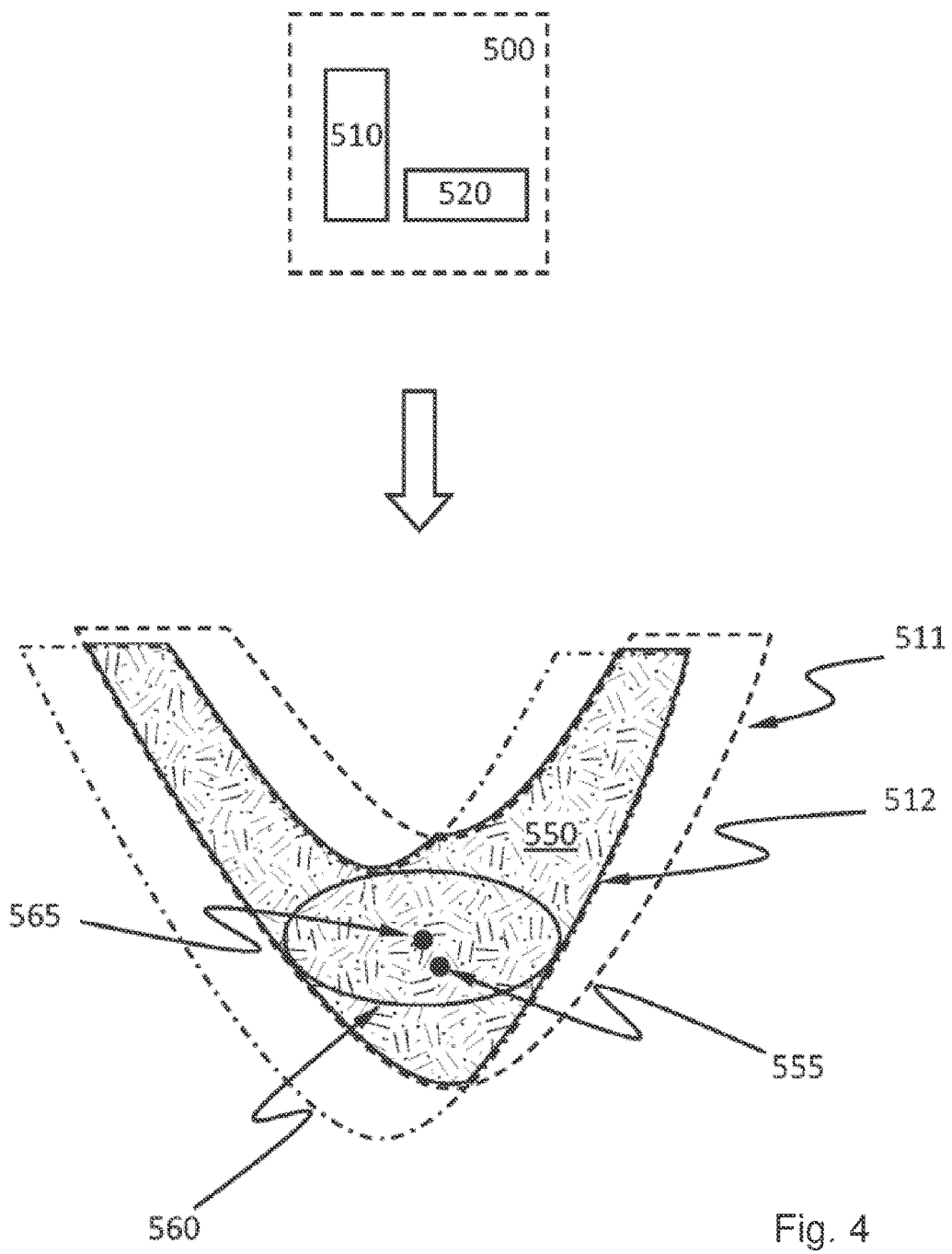
FIG. 4 schematically illustrates a concept of an overlapping process window (OPW)

FIG. 4 schematically illustrates the concept of an OPW. To illustrate the concept, an area, or grid element/pixel, 500 on the patterning device is assumed to have only two individual patterns 510 and 520. The area may include many more patterns. The process windows for the individual patterns 510 and 520 are 511 and 512, respectively. To illustrate the concept, the processing parameters are assumed to only include focus (horizontal axis) and dose (vertical axis). The processing parameters may however include any suitable parameters. The OPW 550 of the area can be obtained by finding the overlap between process windows 511 and 512. The OPW 550 is represented as the hatched area in FIG. 4. The OPW 550 can have an irregular shape. However, in order to easily represent the OPW and to easily determine whether a set of processing parameter values are within the OPW, a "fitted OPW" (e.g., ellipse 560) may be used instead. The "fitted OPW" can be, for example, the largest hyper ellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 555 is the point in the processing parameter space that is as far away as possible from the boundary of the OPW 550 and point 565 is the point in the processing parameter space that is as far away as possible from the boundary of the fitted OPW 560. Point 555 and point 565 may be referred to as the nominal condition. During or before imaging, if the processing parameters shift away from point 555 or point 565, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas, etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

The lithographic control is typically performed using offline calculation of one or more set-point corrections for one or more particular control degrees of freedom, based on (for example) measurements of previously formed structures. The set-point corrections may comprise a correction for a particular process parameter, and may comprise the correction of a setting of a particular degree of freedom to compensate for any drift or error such that the measured process parameter remains within specification (e.g., within an allowed variation from a best setpoint or best value; for example, an OPW or process window). For example, an important process parameter is focus, and a focus error may manifest itself in a defective structure being formed on a substrate. In a typical focus control loop, a focus feedback methodology may be used. Such a methodology may comprise a metrology step which may measure the focus setting used on a formed structure; e.g., by using diffraction based focus (DBF) techniques in which a target with focus dependent asymmetry is formed such that the focus setting can be subsequently determined by measurement of the asymmetry on the target. The measured focus setting may then be used to determine, offline, a correction for the lithographic process; for example a positional correction for one or both of the reticle stage or substrate stage which corrects the focus offset (defocus). Such an offline positional correction may then be conveyed to the scanner as a set-point best focus correction, for direct actuation by the scanner. The measurements may be obtained over a number of lots, with an average (over the lots) best focus correction applied to each substrate of one or more subsequent lots.

Figure 5:
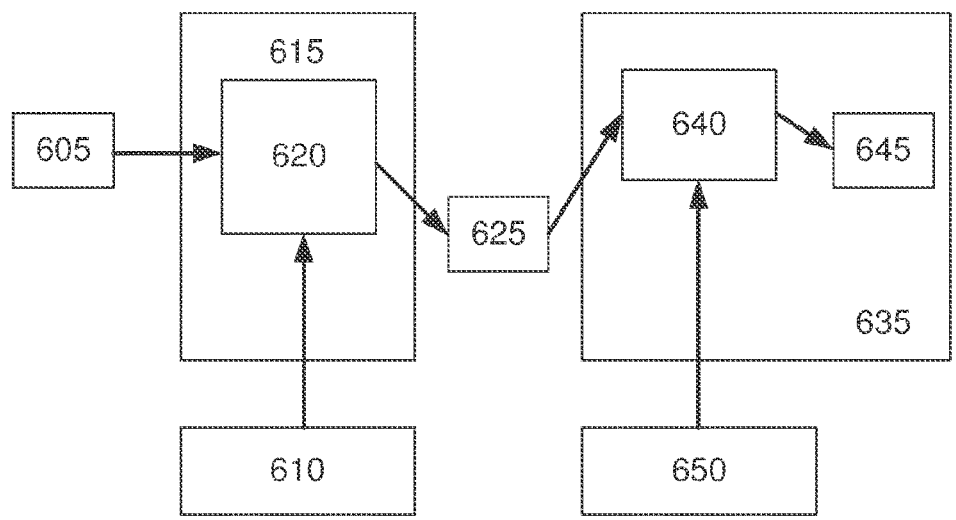
FIG. 5 illustrates schematically a current method of determining corrections for control of a lithographic apparatus.

FIG. 5 illustrates such a methodology. It shows product information 605, such as product layout, illumination mode, product micro-topography etc., and metrology data 610 (e.g., defocus data or overlay data measured from previously produced substrates) being fed to an offline processing device 615 which performs an optimization algorithm 620. The output of the optimization algorithm 620 comprises one or more set-point corrections 625, e.g., for actuators which control reticle stage and/or substrate stage positioning within scanner 635. The set-point corrections 625 typically comprise simple correction offsets calculated to compensate for any offset errors (e.g., defocus, dose or overlay offset errors) comprised within the metrology data 610. The corrections for control reticle stage and/or substrate stage positioning may be, for example, control corrections in any direction, i.e., in the x, y and/or z directions, where x and y define the substrate plane and z is perpendicular to this plane. More specifically, they may comprise x/y direction corrections which correct for overlay/alignment errors, and/or z direction corrections which correct for focus errors. A control algorithm 640 (e.g., leveling algorithm) calculates control set-points 645 using substrate specific metrology data 650. For example, a leveling exposure trajectory (e.g., determining a relative movement or acceleration profile for positioning of the substrate stage relative to the reticle stage during the lithographic process) may be calculated using leveling data (e.g., a wafer height map) and outputs positional set-points 645 for the scanner actuators. The scanner 635 directly applies, equally for each substrate, the set-point corrections (offsets) 625 to the calculated set-points 645.

A downside of such a methodology is that it is not possible to determine corrections which are optimized per substrate. As is known, each substrate will undergo one or more substrate specific metrology steps (e.g., per substrate and/or per layer) before having a structure formed thereon (i.e., to obtain the substrate specific metrology data 650 of FIG. 5). These metrology steps may comprise, for example, a leveling measurement to determine height variation over the substrate (e.g., a wafer height map). As focus is essentially dependent upon the height of the reticle with respect to the substrate surface, such height variations, if not corrected for, will result in local focus variation over the substrate. Therefore, typically the position of the substrate and/or reticle is dynamically controlled (using the available degrees of freedom) during formation of structures over the substrate surface, so as to attempt to compensate for the measured height variation. However, as the determined best focus set-point correction is calculated offline as an average correction (e.g., per lot or number of lots), it can only be applied equally to each of the substrates without regard to the measured height map, i.e., the substrate-specific height variation of each substrate. This leads to a non-optimal correction.

Similarly, at present, an offline overlay and/or edge placement optimization calculates only a set-point positional correction based on averaged alignment data over a lot and therefore cannot calculate a per-substrate or per-layer optimization using the alignment data or wafer height map (as height variation may also affect overlay and edge placement) measured as each substrate is loaded on the scanner.

Figure 6:
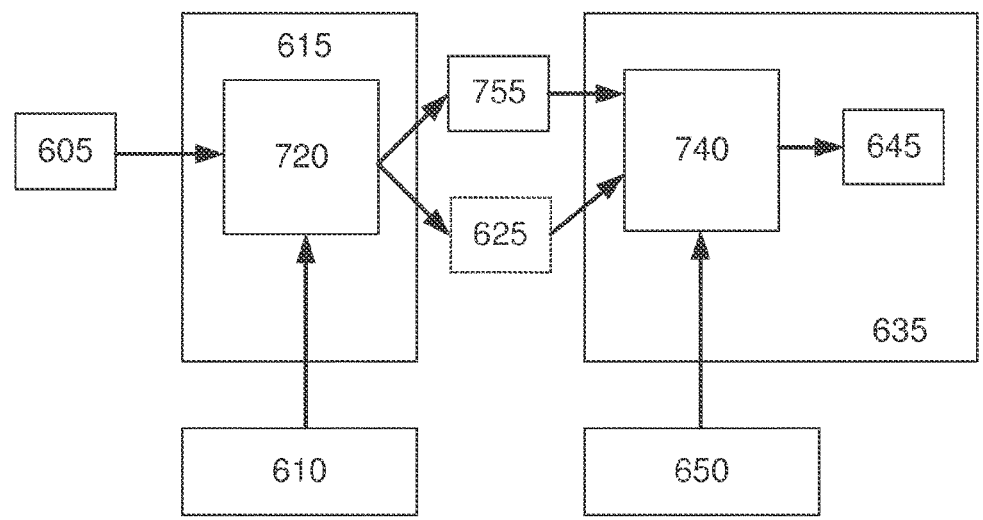
FIG. 6 illustrates schematically a method of determining corrections for control of a lithographic apparatus according to embodiments of the invention.

It is therefore proposed, as illustrated in FIG. 6, to perform real-time optimization for such process parameters. FIG. 6 again shows an offline processing device 615 receiving product information 605, such as product layout, illumination mode, product micro-topography etc., and metrology data 610 (e.g., measurements of at least one performance parameter from previously exposed substrates). However, the algorithm 720 now calculates optimization data 755 comprising an optimization sub-recipe. The optimization data 755 may comprise, for example, one or more of: die layout information, dead die data (e.g., a dead die map as will be described in more detail below), best setting data comprising estimated or known best settings for the performance parameter (e.g., in the form of a best setting map), criticality data (e.g., an allowed process parameter variation space such as a process window which may or may not be associated with the best setting map), a modelled (estimated) value for the performance parameter (e.g., an estimation map), or a desired Moving Average (MA) to time Moving Standard Deviation (MSD) balance ratio (MA: MSD) which will be described below. It should be noted that this list is non-exhaustive.

This optimization sub-recipe 755 is conveyed to the scanner 635, and is used by a scanner algorithm 740, along with substrate specific metrology data 650 to determine corrections (e.g., corrected set-points) 645, for example, on a per-substrate and/or per-layer basis. Therefore, instead of calculating a set-point correction offline based on (e.g., offline metrology) and feeding this set-point correction forward to the scanner 635, an optimization sub-recipe (e.g., a suitable optimization function) 755 is calculated based on the offline metrology 610, with the actual optimization performed and set-points calculated within the scanner (additional set-point corrections 625 may optionally be calculated offline), using the results of any per substrate metrology 650.

Using the specific example of focus, as described above, instead of making offline calculations of focus set-point corrections (e.g., reticle/substrate stage set-point position corrections and lens aberration corrections) and forwarding these for direct implementation by the scanner control, it is now proposed that the offline algorithm 720 is used to determine a focus optimization sub-recipe 755. The optimization sub-recipe 755 is then used by the scanner 635 to optimize focus in real-time using, for example, substrate height variation data (the wafer height map) and lens aberration state data. As such, the algorithm 740 may comprise a leveling algorithm controlling the substrate and/or reticle stages and a lens aberration algorithm for lens control; the substrate specific metrology data 650 comprising a wafer height map and measured lens aberration data. As a consequence, the actuation set-points 645 may be calculated on a per substrate or per layer basis and optimized using the levelling data of each substrate, as well as (for example) the die layout and micro-topography for each layer, in combination with any offline metrology data. Such a proposal will require modification to the interface between the offline processing device 615 and scanner 635 and the scanner 635 control.

Per substrate optimization of, for example, dose or overlay is also possible, possibly using other substrate specific metrology data. for example, optimization of overlay and/or edge placement control can be improved using substrate specific alignment metrology, possibly in combination with lens aberration data and a continuous wafer height map (as will be described below). In the example of dose, the only metrology typically available is the average spot intensity from the spot sensor. Using the techniques described herein, a per substrate optimization of dose may use (e.g., in addition to the average spot intensity), substrate specific metrology comprising a slit profile for every substrate, such that a dose optimization (e.g., between the slit profile and scan profile) can be performed per substrate. As will be described later in the description, the per substrate optimization may comprise a co-optimization which co-optimizes two or more of these (or other) process parameters.

In embodiments, the substrate specific metrology data may comprise offline substrate specific metrology data. This may comprise one or more of: micro topology data, Level Sensor process dependency data, layer thickness profile data, global shape and/or bending data. In embodiments, the substrate specific metrology data may comprise metrology regarding the state of the scanner at the time of exposure, e.g., lens aberrations of the projection optics, for example.

In embodiments, the substrate specific metrology data may comprise modeled and/or filtered metrology data. In an embodiment, the substrate specific metrology data may comprise a continuous substrate map or continuous wafer map (CWM). The continuous wafer map may comprise a model which corrects for one or more of: sensor noise, sensor calibration drift, sensor data filtering artefacts, sparse sampling limitations and/or finite sensor spot size in a sampled substrate map which maps the process parameter variation across the substrate. A CWM, in some systems, is presently maintained offline. The CWM can now be maintained within the scanner and updated in real time (e.g., updated per substrate).

In an embodiment, the tuning optimization recipe (optimization data) may comprise some or all of the following (non-exhaustive):

- a best parameter value or setpoint map per field (or die). This may comprise, for example, a best focus map (where the process parameter(s) include focus) and/or a best energy map (where the process parameter(s) include dose).
- An allowed variation space for the process parameter (e.g., allowed variation range or process window) per point in field (or die). This may comprise a depth of focus map and/or an exposure latitude map for example.
- A set of optimization balancing definitions/weights which may include, for example: litho metric equations for lens aberration impact balancing such as described in WO2009/148976 (hereby incorporated herein by reference), levelling MA:MSD ratio (z direction), overlay vs imaging MA:MSDxy, and/or partial:full die weight.
- Additionally, the optimization data may comprise reference data. The reference data may comprise, more specifically, estimated/modeled data such as an estimation map from metrology data, e.g., an estimated focus map or estimated effective dose map (CD divided by dose sensitivity). The optimization data may also comprise per-layer data (e.g., die layout data and/or dead die data).

In a specific example for focus optimization, the focus tuning optimization recipe may comprise (or be derived from) some or all of the following:

- Intrafield best focus (BF) map containing e.g., micro topology data, or modeled best focus shifts (e.g., using a 3-dimensional reticle model, for example as described in U.S. Pat. No. 7,703,069 B1 incorporated herein by reference) for process window optimization—e.g., more specifically an advanced, product aware, dies-in-spec optimization. Best focus data may be corrected for variation through imaging effects (mask 3D effects, resist 3D, aberrations);
- Intrafield depth of focus (DoF) map for Process Window optimization;
- Die layout for dies-in-spec optimization;
- Dead die list for advanced dies-in-spec optimization;
- On-product focus estimation model result, based on on-product metrology. The metrology data may be corrected for MA and/or MSD residuals (and possibly also lens aberration residuals e.g., Zernikes Z5 and Z9 (or Z6)) fed back from the scanner control using, for example, computational metrology techniques.

The scanner control may use the optimization data to perform an optimization, which may comprise:

- Dies-in-spec optimization; a maximum absolute (max abs) per die optimization which minimizes the maximum deviation of the performance parameter from a control target, possibly combined with sacrificing a die in favor of another one;
- Process window optimization; this could be essentially similar to the dies-in-spec optimization, but further using the best parameter value map and/or allowed variation space data (process window map). Such a process window optimization may comprise minimizing the maximum deviation of the performance parameter from a corresponding best parameter value and/or maximizing the distance of the performance parameter from edges of a corresponding allowed variation space. More specifically, a process window optimization may comprise maximizing over an optimization space, the minimum distance between a) a local excursion of said performance parameter with respect to a corresponding best parameter value (or other control target value) and b) a local edge of the corresponding allowed variation space. If only a best parameter value map is available without a process window map then the optimization may be performed using a constant (assumed) process window for each die. If only a process window map is available without a best parameter value map then then the optimization may be performed using the assumption that the best parameter value is the center of each process window, or else zero or other arbitrary value. Such a process window optimization is described (specifically in terms of correction of lens aberrations) in the aforementioned WO2009/148976. Alternative optimization strategies are possible such as using local weights based on the best parameter value map (e.g., weighting based on the reciprocal of the depth of focus), or using an algorithm as used in pattern fidelity control;

The ability to co-optimize more than one process parameter; e.g., determine a single or combined correction for one or more degrees of freedom within the scanner/process control; thereby replacing separate optimizations for focus, dose, overlay and/or lens aberration etc. This concept will be described in more detail below.

As mentioned above, in an embodiment, the process parameter optimization (e.g., focus optimization) may comprise a "dies-in-spec" optimization. This aims to maximize the number of dies that are within specification, rather than applying an averaged optimization across the substrate (e.g., a least-squares optimization based on a least squares minimization of focus difference from best focus across the substrate). As such, a "dies-in-spec" optimization uses prior knowledge of the product (the die layout) when optimizing the process parameter. A least squares optimization typically treats each location equally, without taking into account the die layout. As such, a least squares optimization may prefer a correction which "only" results in four locations being out-of-specification, but each in a different die, over a correction which has seven locations out-of-specification, but which only affect two dies (e.g., four defects in one die, three in another). However, as only a single defect will tend to render a die defective, maximizing the number of defect-free dies (i.e., dies-in-spec) is ultimately more important than simply minimizing the number of defects per substrate. It should be appreciated that dies-in-spec optimization may comprise a maximum absolute (max abs) per die optimization. Such a max abs optimization may minimize the maximum deviation of the performance parameter from a control target. A differentiable approximation for the max abs function could be used instead, so that the cost function is easier to solve. For this to be effective, detail such as the wafer map should be used in the optimization.

In an embodiment, the dies-in-spec optimization may be further improved by using a "dead dies" database. Such a database is maintained dynamically and records all instances where a die is believed to have, or is estimated will have at least one defect (e.g., using previous yield data, data form other lithographic process and/or a defocus estimation map), such that it is considered to be dead (defective). Such dead dies may then be further sacrificed in the optimization. This may be achieved by attributing a very large or limitless process window to the dead die, beyond that of the actual limits for it to be functional. By increasing the likelihood of more defects in the dead die, more flexibility may be provided for optimization or control for the other dies. This may therefore lower the likelihood of a defect in another die in an optimization for that same layer, or for successive layers, thereby further maximizing the number of dies-in-spec.

In addition to maximizing the number of in-spec dies, the dies-in-spec optimization may be further improved, in an embodiment, by performing process window optimization which maximizes the process window margin (the degree to which the focus or other process parameter is within-spec), per substrate or layer. This may comprise using a parameter value (e.g., defocus) estimation map and product layout information (e.g., BF and DoF maps). The defocus estimation map may be obtained via computational metrology (e.g., lithographic process modeling). Computational metrology process window optimization may use these maps to maximize the margin of the modeled parameter value (e.g., focus) with respect to the corresponding process window (e.g., depth of focus) and/or minimize the difference between the modeled parameter value with respect to the corresponding best parameter value (e.g., best focus). As such, this method may comprise a maximization over an optimization space, of the minimum distance between a) a local excursion of said performance parameter with respect to a corresponding best parameter value (or other control target value) and b) a local edge of the corresponding allowed variation space.

A dies-in-spec optimization may comprise an iterative process whereby residuals of a first estimate (possibly comprising a least-squares fit) are calculated, and based on this the likelihood of a defect resulting from each residual. A maximum defect likelihood per die is calculated and the number of dies likely to have defects is determined. Then, over a number of iterations recommencing with the calculation of residuals, the relevant parameters are varied to minimize the number of dies likely to have defects.

The calculated optimization sub-recipe 755 may be operable to change the merit function of the appropriate control algorithm 740 (e.g., leveling algorithm) using, for example, one or more of: best parameter data (e.g., BF map) and criticality data (e.g., DoF map), MA/MSD weight ratio, die layout, full/partial die weight ratio and dead die map.

The MA/MSD weight ratio comprises the relative importance in the levelling algorithm given to a time Moving Average (MA) error and a time Moving Standard Deviation (MSD) of the error of a lithographic stage. A critical time window here is the time interval that each point on a die is exposed (in other words: receives photons). If the average position error for a point on the die during this time interval is high (in other words: high MA-error), the effect is a shift of the exposed image, resulting in focus and/or overlay errors. If the standard deviation of the position error during this time interval is high (in other words: high MSD error), the image may smear, resulting in fading errors. In many situations, a ratio of 1 (equal weighing) will be preferred for focus (e.g., control in the z direction) and a ratio greater than 1 for overlay versus imaging (e.g., control in the x/y plane). However, in other applications, a different ratio may be used. For example, in 3D NAND applications there may be a low overlapping DOF between high and low layers. It may be that deviating from the overlapping DOF in such a case may be worse than losing a bit of contrast. Therefore the optimization sub-recipe may change the (merit function) levelling algorithm to give a less severe weighting of MSD with respect to MA.

While the above methodology is described in terms of focus, dose or overlay optimization, other scanner parameters could be included, such as Jones pupil beyond aberration, laser bandwidth, contrast MSDxyz from stage and lens element movements. Optimization may also comprise a co-optimization of any combination of two or more of these or other process parameters as will now be described.

The concepts described above may be expanded to obtain a very significant benefit of a co-optimized scanner control whereby a co-optimized correction is determined based on optimization data relating to more than one process parameter, so as to optimize each of those process parameters (or a subset thereof) and/or a related (e.g., dependent) process parameter. For example, the scanner may co-optimize focus and dose for optimized critical dimension (CD) and/or to minimize defects. In another embodiment, the scanner may use one or more optimization recipes, levelling data (wafer map) and alignment data to co-optimize focus, dose and overlay for optimized edge placement error (EPE). EPE is the combined error resultant from (global and local) CD uniformity error and overlay error. Because the optimization is performed within the scanner based on one or more sub-recipes, any optimization may take into account all degrees of freedom (actuation and control) of the scanner to optimize for any error based upon all available input data. Such a co-optimization is beneficial as with individual (e.g., focus, dose, aberration, overlay) optimizations performed presently, not all errors are independent or individually correctable and different optimizations may require contradictory corrections. For example, optimization of focus across slit is limited as the "slit cannot be bent", i.e., the focus cannot be directly varied non-linearly across the slit by a non-linear variation of distance between reticle and substrate stage. However, in a co-optimization strategy, it may be possible to achieve some of the benefits of direct focus control across the slit by varying dose across the slit and/or via the projection lens optics (e.g., a lens manipulator), for example, so as to optimize EPE or CD.

The co-optimization may also include lens control which compensates for lens aberrations. The scanner may include an optimization sub-recipe associated with a desired balancing of lens aberrations. The optimization sub-recipe recipe may be based on knowledge of critical product structures and their tolerances with respect to individual aberration components (Zernikes). The Scanner can measures a lens aberration profile for every substrate and use this as a further input in a co-optimization which also uses lens control as a further degree of freedom. Scanner optimization of lens control based upon an optimization recipe is described in WO2009/148976 which is herein incorporated by reference in its entirety.

As such, it is disclosed herein to use focus, dose, overlay or other process parameters, or combinations thereof to determine a product specific scanner optimization sub-recipe (offline) and use this to determine a performance based scanner optimization algorithm, which allows input from the optimization sub-recipe and can be calculated per substrate or per layer based on substrate specific metrology.

A further advantage of the proposed methodology is that the product specific information is not inputted directly to the scanner, but only to the offline processing device which uses this to determine an optimization sub-recipe. This optimization sub-recipe is fairly neutral with regard to the sensitive product specific information which is essentially hidden from the scanner. This will be beneficial for parties who may wish to ensure such information product specific information remains confidential.

Further embodiments of the invention are disclosed in the list of numbered embodiments below:

1. A method for controlling a lithographic apparatus configured to provide product structures to a substrate in a lithographic process, the method comprising:

determining optimization data comprising measured and/or simulated data of at least one performance parameter associated with the product structures and/or their arrangement which are to be applied to the substrate in the lithographic process;

determining substrate specific metrology data as measured and/or modeled before the providing of product structures to the substrate, said substrate specific metrology data comprising metrology data relating to a characteristic of the substrate to which the structures are being applied and/or the state of the lithographic apparatus at the time that the structures are applied to the substrate; and optimizing control of the lithographic apparatus during the lithographic process based on said optimization data and the substrate specific metrology data.

2. A method according to embodiment 1, wherein said substrate specific metrology data describes one or more of: a characteristic of the substrate; a characteristic of a patterning device which defines a device pattern which is to be applied to the substrate; a position of one or both of a substrate stage for holding the substrate and a reticle stage for holding a patterning device; or a characteristic of a radiation system which provides a radiation beam for transferring a pattern on said patterning device to the substrate.

3. A method according to embodiment 1 or 2, wherein said determining optimization data step is performed offline and said optimizing control step is performed between determining said substrate specific metrology data and said providing of product structures to the substrate.

4. A method according to embodiment 3, wherein said determining optimization data step is performed outside of said lithographic apparatus and said optimizing control step is performed within the lithographic apparatus.

5. A method according to any preceding embodiment, wherein said optimizing control step is performed separately for each substrate on which said product structures are provided based on substrate specific metrology data corresponding to that substrate.

6. A method according to any preceding embodiment, wherein said optimization data comprises device layout data, associated with the patterning device.

7. A method according to any preceding embodiment, wherein said optimization step comprises minimizing the maximum deviation of the performance parameter from a corresponding control target value and/or maximizing the distance of the performance parameter from edges of a corresponding allowed variation space for the process parameter.

8. A method according to embodiment 7, wherein said optimization step comprises maximizing the number of dies provided on the substrate which are estimated to be within a specification indicative that the die will be functional.

9. A method according to embodiment 8, wherein said optimization step comprises maximizing the number of dies which comprise no defects.

10. A method according to embodiment 8 or 9, wherein said optimization data comprises dead die data indicative of which dies are deemed not functional because there is estimated to be at least one defect in at least one layer of said die.

11. A method according to any of embodiments 7 to 10, wherein said optimization data comprises best parameter value data relating to one or more of said at least one process parameter, said control target value being derived from, or defined by, the best parameter value data.

12. A method according to embodiment 11, wherein said best parameter value data comprises a best focus map describing the best focus settings across a field and/or across a die.

13. A method according to embodiment 12, wherein said best focus map comprises micro topology data describing expected height variation within a die according to associated product layout data.

14. A method according to embodiment 11, 12 or 13, wherein said best parameter value data comprises a best energy map describing the best energy settings across a field and/or across a die.

15. A method according to any of embodiments 7 to 14, wherein said optimization data comprises criticality data for one or more of said at least one process parameter, said criticality data defining an allowed variation space across a field and/or across a die for the process parameter.

16. A method according to embodiment 15, comprising maximizing over an optimization space, the minimum distance between a) a local excursion of said performance parameter with respect to the corresponding control target value and b) a local edge of a corresponding allowed variation space.

17. A method according to any preceding embodiment, wherein said optimizing step comprises using said optimization data to determine weighting of a merit function for optimization of at least one control parameter of the lithographic apparatus.

18. A method according to embodiment 17, wherein said at least one control parameter relates to control of the substrate stage and/or reticle stage of the lithographic apparatus, thereby controlling the relative position of the substrate stage with respect to the reticle stage.

19. A method according to embodiment 17, wherein said at least one control parameter relates to control of a projection system of the lithographic apparatus.

20. A method according to any preceding embodiment, wherein said substrate specific metrology data comprises substrate height variation data.

21. A method according to any preceding embodiment, wherein said substrate specific metrology data comprises modeled and/or filtered metrology data.

22. A method according to any preceding embodiment, wherein said substrate specific metrology data comprises a continuous substrate map, the continuous substrate map comprising a model which corrects for one or more of: sensor noise, sensor calibration drift, sensor data filtering artefacts, sparse sampling limitations and/or finite sensor spot size in a sampled substrate map which maps the process parameter variation across the substrate.

23. A method according to any preceding embodiment, wherein said substrate specific metrology data comprises patterning device height variation data.

24. A method according to any preceding embodiment, wherein said substrate specific metrology data comprises offline substrate metrology data.

25. A method according to embodiment 24, wherein said offline substrate specific metrology data comprises one or more of micro topology data, Level Sensor process dependency data, layer thickness profile data, global substrate shape and substrate bending data.

26. A method according to any preceding embodiment, wherein the optimization data comprises a preferred ratio of: a Moving Average error, and a time Moving Standard Deviation of the error; of the substrate stage and/or reticle stage and/or lens aberration impact.

27. A method according to any preceding embodiment, wherein said optimization data comprises estimated data for said performance parameter.

28. A method according to any preceding embodiment, wherein said optimization data comprises measured data relating to measurement of the at least one performance parameter from product structures which have been previously provided to a substrate.

29. A method according to any preceding embodiment, wherein said substrate specific metrology data comprises alignment data relating to a position of one or both of the substrate stage and reticle stage.

30. A method according to any preceding embodiment, wherein said at least one performance parameter comprises one of: focus, dose, overlay, radiation system output bandwidth and contrast Moving Standard Deviation of an error in substrate stage and/or reticle stage positioning, and said optimization step comprises optimizing control of the lithographic apparatus so as to optimize said performance parameter.

31. A method according to any of embodiments 1 to 29, wherein said at least one performance parameter comprises two or more of: focus, dose, overlay, radiation system output bandwidth, contrast from lens aberrations and contrast Moving Standard Deviation of an error in substrate stage and/or reticle stage positioning, and said optimization step comprises co-optimizing control of the lithographic apparatus so as to optimize each of said performance parameters and/or a related performance parameter of the lithographic process.

32. A method according to embodiment 31, wherein said related performance parameter comprises edge placement error.

33. A method according to embodiment 31 or 32, wherein each of the process parameters has an associated process window axis of a multi-dimensional process window, the method comprising limiting locally one or more of the process window axes, thereby shifting the setpoint of one or more of the other process window axes.

34. A method according to embodiment 31, 32 or 33, wherein said substrate specific metrology data further comprises a lens aberration profile and said co-optimizing control step comprises using the lens aberration profile to optimize lens control within said lithographic apparatus and/or said related performance parameter.

35. A method according to any preceding embodiment, comprising controlling the lithographic process according to said optimized control.

36. A method according to any preceding embodiment, wherein the lithographic process comprises exposure of a single layer on a substrate, forming part of a manufacturing process for manufacturing an integrated circuit.

37. A processing device for determining optimization data for controlling a lithographic apparatus which is configured to provide product structures to a substrate in a lithographic process, the processing device being configured to:

determine optimization data comprising measured and/or simulated data of at least one performance parameter associated with the product structures and/or their arrangement which are to be applied to the substrate in the lithographic process; said optimization data being usable by the lithographic apparatus in combination with substrate specific metrology data in optimizing control of the lithographic apparatus during the lithographic process; wherein the at least one performance parameter comprises focus, dose, overlay, contrast radiation system output bandwidth and contrast Moving Standard Deviation of an error in substrate stage and/or reticle stage positioning of the lithographic apparatus; and send the optimization data to the lithographic apparatus.

38. A processing device according to embodiment 37, wherein the at least one performance parameter further comprises lens aberration.

39. A processing device according to embodiment 37 or 38, being operable to determine said optimization data offline to the lithographic process.

40. A processing device according to any of embodiments 37 to 39, wherein said optimization data comprises device layout data, associated with a patterning device, and which defines a device pattern which is to be applied to the substrate in the lithographic process.

41. A processing device according to any of embodiments 37 to 40, wherein said optimization data comprises dead die data indicative of which dies are deemed not functional because there is estimated to be at least one defect in at least one layer of said die.

42. A processing device according to any of embodiments 37 to 41, wherein said optimization data comprises best parameter value data relating to one or more of said at least one process parameter.

43. A processing device according to embodiment 42, wherein said best parameter value data comprises a best focus map describing the best focus settings across a field and/or across a die.

44. A processing device according to embodiment 43, wherein said best focus map comprises micro topology data describing expected height variation within a die according to associated product layout data.

45. A processing device according to embodiment 42, 43 or 44, wherein said best parameter value data comprises a best energy map describing the best energy settings across a field and/or across a die.

46. A processing device according to any of embodiments 42 to 45, wherein said optimization data comprises criticality data for one or more of said at least one process parameter, said criticality data defining an allowed variation space across a field and/or across a die for the process parameter.

47. A processing device according to any of embodiments 37 to 46, wherein the optimization data comprises a preferred ratio of:

a Moving Average error, and a time Moving Standard Deviation of the error;

of the substrate stage and/or reticle stage and/or lens aberration impact.

48. A processing device according to any of embodiments 37 to 47, wherein said optimization data comprises estimated data for said performance parameter.

49. A processing device according to any of embodiments 37 to 48, wherein said at least one performance parameter comprises one of: focus, dose, overlay or edge placement error.

50. A lithographic apparatus which is configured to provide product structures to a substrate in a lithographic process, said lithographic apparatus comprising:

a substrate stage for holding the substrate;

a reticle stage for holding a patterning device;

a metrology system operable to measure substrate specific metrology data before the providing of product structures to the substrate; and a processor operable to optimize control of the lithographic apparatus during the lithographic process based on optimization data and the substrate specific metrology data; wherein said optimization data comprising measured and/or simulated data of at least one performance parameter associated with the product structures and/or their arrangement which are to be applied to the substrate in the lithographic process.

51 A lithographic apparatus according to embodiment 50, wherein said substrate specific metrology data describes one or more of: a characteristic of the substrate; a characteristic of the patterning device; a position of one or both of the substrate stage and the reticle stage; or a characteristic of a radiation system which provides a radiation beam for transferring a pattern on said patterning device to the substrate.

52. A lithographic apparatus according to embodiment 50 or 51, wherein said processor is operable to optimize control of the lithographic apparatus between determining said substrate specific metrology data and said providing of product structures to the substrate.

53. A lithographic apparatus according to embodiment 52, being operable to receive said optimization data from an offline processing device.

54. A lithographic apparatus according to any of embodiments 50 to 53, wherein said metrology system is operable to measure said substrate specific metrology data separately for each substrate; and said processor is operable to separately optimize control of the lithographic apparatus for each substrate, based on the corresponding substrate specific metrology data for that substrate.

55. A lithographic apparatus according to any of embodiments 50 to 54, wherein said optimization data comprises device layout data, associated with a patterning device, and which defines a device pattern which is to be applied to the substrate.

56. A lithographic apparatus according to any of embodiments 50 to 55, wherein said processor is configured such that said optimizing control comprises minimizing the maximum deviation of the performance parameter from a corresponding control target value and/or maximizing the distance of the performance parameter from edges of a corresponding allowed variation space for the process parameter.

57. A lithographic apparatus according to embodiment 56, wherein said processor is configured such that said optimizing control comprises maximizing the number of dies provided on the substrate which are estimated to be within a specification indicative that the die will be functional.

58. A lithographic apparatus according to embodiment 57, wherein said processor is configured such that said optimizing control comprises maximizing the number of dies which comprise no defects.

59. A lithographic apparatus according to embodiment 57 or 58, wherein said optimization data comprises dead die data indicative of which dies are deemed not functional because there is estimated to be at least one defect in at least one layer of said die.

60. A lithographic apparatus according to any of embodiments 56 to 59, wherein said optimization data comprises best parameter value data relating to one or more of said at least one process parameter, said control target value being derived from, or defined by, the best parameter value data.

61. A lithographic apparatus according to embodiment 60, wherein said best parameter value data comprises a best focus map describing the best focus settings across a field and/or across a die.

62. A lithographic apparatus according to embodiment 61, wherein said best focus map comprises micro topology data describing expected height variation within a die according to associated product layout data.

63. A lithographic apparatus according to embodiment 60, 61 or 62, wherein said best parameter value data comprises a best energy map describing the best energy settings across a field and/or across a die.

64. A lithographic apparatus according to any of embodiments 56 to 63, wherein said optimization data comprises criticality data for one or more of said at least one process parameter, said criticality data defining an allowed variation space across a field and/or across a die for the process parameter.

65. A lithographic apparatus according to embodiment 64, wherein said processor is configured to maximize over an optimization space, the minimum distance between a) a local excursion of said performance parameter with respect to the corresponding control target value and b) a local edge of a corresponding allowed variation space.

66. A lithographic apparatus according to any of embodiments 50 to 65, wherein said processor is configured such that said optimizing control comprises using said optimization data to determine weighting of a merit function for optimization of at least one control parameter of the lithographic apparatus.

67. A lithographic apparatus according to embodiment 66, wherein said at least one control parameter relates to control of the substrate stage and/or reticle stage, thereby controlling the relative position of the substrate stage with respect to the reticle stage.

68. A lithographic apparatus according to embodiment 66, wherein said lithographic apparatus further comprises a projection system for projecting a beam of radiation, patterned by said patterning device, onto said substrate; and said at least one control parameter relates to control of the projection system.

69. A lithographic apparatus according to any of embodiments 50 to 68, wherein said substrate specific metrology data comprises substrate height variation data.

70. A lithographic apparatus according to any of embodiments 50 to 69, wherein said substrate specific metrology data comprises modeled and/or filtered metrology data.

71. A lithographic apparatus according to any of embodiments 50 to 70, wherein said substrate specific metrology data comprises offline substrate metrology data.

72. A lithographic apparatus according to embodiment 71, wherein said offline substrate specific metrology data comprises one or more of: micro topology data, Level Sensor process dependency data, layer thickness profile data, substrate global shape data and substrate bending data.

73. A lithographic apparatus according to any of embodiments 50 to 72, wherein said substrate specific metrology data comprises a continuous substrate map, the continuous substrate map comprising a model which corrects for one or more of: sensor noise, sensor calibration drift, sensor data filtering artefacts, sparse sampling limitations and/or finite sensor spot size in a sampled substrate map which maps the process parameter variation across the substrate.

74. A lithographic apparatus according to any of embodiments 50 to 73, wherein the optimization data comprises a preferred ratio of:
a Moving Average error, and
a time Moving Standard Deviation of the error;
of the substrate stage and/or reticle stage and/or lens aberration impact.

75. A lithographic apparatus according to any of embodiments 50 to 74, wherein said optimization data comprises estimated data for said performance parameter.

76. A lithographic apparatus according to any of embodiments 50 to 75, wherein said substrate specific metrology data comprises alignment data relating to a position of one or both of the substrate stage and reticle stage.

77. A lithographic apparatus according to any of embodiments 50 to 76, wherein said at least one performance parameter comprises one of: focus, dose, overlay, radiation system output bandwidth and contrast Moving Standard Deviation of an error in substrate stage and/or reticle stage positioning, and
said processor is configured such that said optimizing control comprises optimizing control of the lithographic apparatus so as to optimize said performance parameter.

78. A lithographic apparatus according to any of embodiments 50 to 76, wherein said at least one performance parameter comprises two or more of: focus, dose, overlay, radiation system output bandwidth and contrast Moving Standard Deviation of an error in substrate stage and/or reticle stage positioning, and
said processor is configured such that said optimizing control comprises co-optimizing control of the lithographic apparatus so as to optimize each of said performance parameters and/or a related performance parameter of the lithographic process.

79. A lithographic apparatus according to embodiment 78, wherein said related performance parameter comprises edge placement error.

80. A lithographic apparatus according to embodiment 78 or 79, wherein said substrate specific metrology data further comprises a lens aberration profile, and said processor is configured such that said co-optimizing control comprises using the lens aberration profile to optimize lens control within said lithographic apparatus and/or said related performance parameter.

81. A processing device according to any of embodiments 37 to 49, and a lithographic apparatus according to any of embodiments 50 to 80; wherein the processing device is operable to determine said optimization data for controlling said lithographic process on said lithographic apparatus.

82. A computer program comprising program instructions operable to perform the method of any of embodiments 1 to 36, when run on a suitable apparatus.

83. A non-transient computer program carrier comprising the computer program of embodiment 82.

Within this disclosure, any mention of an allowed variation space or process window may comprise an overlapping process window as described and/or an N-dimensional dimensional process window (e.g., the axes may comprise one or more of focus, dose, overlay, contrast, etc.). In an embodiment, process window tracking may be employed. This comprises limiting locally one (or more) of the process window axes, thereby shifting the set point of another axis or axes. Process window tracking is described in WO2016202559, which is hereby incorporated by reference. In all cases the process window (or more generally the criticality metric) may be determined from product information or reticle design information (relating to the structures being exposed) and/or simulated design information to determine the process window information.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A processing device for determining optimization data for controlling a lithographic apparatus which is configured to provide product structures to a substrate in a lithographic process, the processing device configured to at least:
    determine optimization data comprising measured and/or simulated data of at least one performance parameter associated with the product structures and/or their arrangement which are to be applied to the substrate in the lithographic process, the optimization data usable by the lithographic apparatus in combination with substrate specific metrology data in optimizing control of the lithographic apparatus during the lithographic process, wherein the at least one performance parameter comprises one or more selected from: focus, dose, overlay, contrast, edge placement error, radiation system output bandwidth, and/or contrast moving standard deviation of an error in substrate stage and/or reticle stage positioning of the lithographic apparatus; and
    send the optimization data to the lithographic apparatus.

2. The processing device according to claim 1, wherein the at least one performance parameter further comprises lens aberration.

3. The processing device according to claim 1, configured to determine the optimization data offline to the lithographic process.

4. The processing device according to claim 1, wherein the optimization data comprises device layout data, associated with a patterning device, and which defines a device pattern which is to be applied to the substrate in the lithographic process.

5. The processing device according to claim 1, wherein the optimization data comprises dead die data indicative of which dies are deemed not functional because there is estimated to be at least one defect in at least one layer of the die.

6. The processing device according to claim 1, wherein the optimization data comprises best parameter value data relating to one or more of the at least one performance parameter.

7. The processing device according to claim 1, wherein the optimization data comprises a preferred ratio of:
    a moving average error of the substrate stage and/or reticle stage and/or lens aberration impact, and
    a time moving standard deviation of error of the substrate stage and/or reticle stage and/or lens aberration impact.

8. A non-transitory computer program carrier comprising a computer program comprising program instructions that, when run by a computer processor system, are configured to cause the computer processor system to at least:
    determine optimization data comprising measured and/or simulated data of at least one performance parameter associated with product structures and/or their arrangement which are to be applied to a substrate in a lithographic process, the optimization data usable by a lithographic apparatus in combination with substrate specific metrology data in optimizing control of the lithographic apparatus during the lithographic process, wherein the at least one performance parameter comprises one or more selected from: focus, dose, overlay, contrast, edge placement error, radiation system output bandwidth, and/or contrast moving standard deviation of an error in substrate stage and/or reticle stage positioning of the lithographic apparatus; and
    send the optimization data to a lithographic apparatus.

9. The carrier according to claim 8, wherein the at least one performance parameter further comprises lens aberration.

10. The carrier according to claim 8, wherein the instructions are configured to cause the computer system to determine the optimization data offline to the lithographic process.

11. The carrier according to claim 8, wherein the optimization data comprises device layout data, associated with a patterning device, and which defines a device pattern which is to be applied to the substrate in the lithographic process.

12. The carrier according to claim 8, wherein the optimization data comprises dead die data indicative of which dies are deemed not functional because there is estimated to be at least one defect in at least one layer of the die.

13. The carrier according to claim 8, wherein the optimization data comprises best parameter value data relating to one or more of the at least one performance parameter.

14. The carrier according to claim 13, wherein the best parameter value data comprises a best focus map describing the best focus settings across a field and/or across a die.

15. The carrier according to claim 14, wherein the best focus map comprises micro topology data describing expected height variation within a die according to associated product layout data.

16. The carrier according to claim 13, wherein the best parameter value data comprises a best energy map describing the best energy settings across a field and/or across a die.

17. The carrier according to claim 8, wherein the optimization data comprises a preferred ratio of:
    a moving average error of the substrate stage and/or reticle stage and/or lens aberration impact, and
    a time moving standard deviation of error of the substrate stage and/or reticle stage and/or lens aberration impact.

18. The carrier according to claim 8, wherein the optimization data comprises criticality data for one or more process parameters, the criticality data defining an allowed variation space across a field and/or across a die for the one or more process parameters.

19. The carrier according to claim 8, wherein the optimization data comprises estimated data for the at least one performance parameter.

20. The carrier according to claim 8, wherein the at least one performance parameter comprises one or more selected from focus, dose, overlay or edge placement error.

* * * * *